(12) United States Patent
Muhammad

(10) Patent No.: US 8,478,213 B2
(45) Date of Patent: Jul. 2, 2013

(54) METHODS AND APPARATUS FOR POWER CONTROL

(75) Inventor: Khurram Muhammad, Garland, TX (US)

(73) Assignee: Research In Motion Limited (CA)

( * ) Notice: Subject to any disclaimer, the term of this patent is extended or adjusted under 35 U.S.C. 154(b) by 0 days.

(21) Appl. No.: 13/273,768

(22) Filed: Oct. 14, 2011

(65) Prior Publication Data

US 2013/0095777 A1  Apr. 18, 2013

(51) Int. Cl.
*H04B 1/04* (2006.01)

(52) U.S. Cl.
USPC .......................................... 455/127.1; 455/91

(58) Field of Classification Search
USPC .................. 455/522, 91, 114.2, 114.3, 127.1, 455/127.2, 126; 330/278, 279
See application file for complete search history.

(56) References Cited

U.S. PATENT DOCUMENTS

| | | | | |
|---|---|---|---|---|
| 5,345,598 | A * | 9/1994 | Dent | 455/522 |
| 5,737,697 | A * | 4/1998 | Yamada | 455/126 |
| 6,721,368 | B1 * | 4/2004 | Younis et al. | 375/295 |
| 7,109,792 | B2 * | 9/2006 | Leffel | 330/149 |
| 7,250,818 | B2 * | 7/2007 | Ayun et al. | 330/140 |
| 7,555,268 | B2 | 6/2009 | Trachewsky et al. | |
| 7,902,892 | B2 * | 3/2011 | Pratt et al. | 327/170 |
| 2003/0169094 | A1 | 9/2003 | Zhang et al. | |
| 2005/0122171 | A1 | 6/2005 | Miki et al. | |
| 2005/0148300 | A1 | 7/2005 | Salvi et al. | |
| 2005/0159177 | A1 | 7/2005 | Trachewsky et al. | |
| 2005/0245212 | A1 | 11/2005 | Ono et al. | |
| 2007/0037530 | A1 | 2/2007 | Peckham et al. | |
| 2009/0309661 | A1 | 12/2009 | Chang et al. | |
| 2010/0117737 | A1 | 5/2010 | Kondo et al. | |

FOREIGN PATENT DOCUMENTS

EP    1892827 A1    2/2008

OTHER PUBLICATIONS

"European Application Serial No. 11185325.5, Extended Search Report mailed Jul. 2, 2012", 22 pgs.
"European Application Serial No. 11185325.5, Partial Search Report mailed Mar. 23, 2012", 8 pgs.

* cited by examiner

*Primary Examiner* — Sonny Trinh
(74) *Attorney, Agent, or Firm* — Schwegman Lundberg Woessner P.A.

(57) ABSTRACT

Various embodiments include a method for controlling power in a transmitter, the method comprising measuring an indication of an output power of the transmitter, comparing a first value corresponding to the indication of the output power to a second value corresponding to a desired output power; and adjusting a bias of at least one component in the transmitter in order to bring the output power closer to the desired output power. Embodiments also include various methods, systems and apparatus.

16 Claims, 9 Drawing Sheets

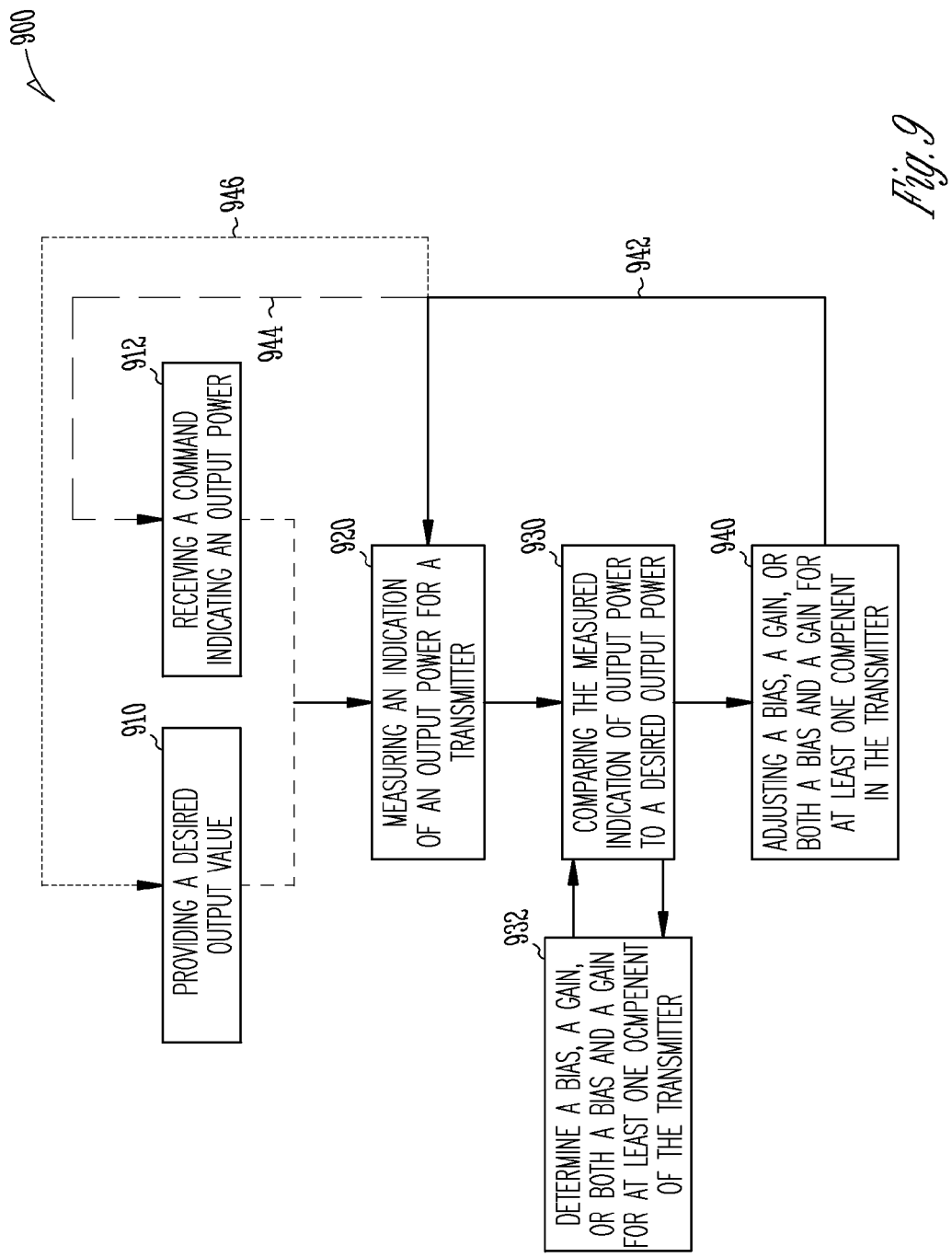

METHODS AND APPARATUS FOR POWER CONTROL

BACKGROUND

Many communication protocols require accurate power control of a transmitted signal in order to, for example, control interference between signals from different communication devices. This power control can be accomplished in the form of a command from a base station (e.g., eNodeB, access point) to a client station. The command can provide a power output quantity for the base station. When the client station receives the command, the client station adjusts the power output by the transmitter to match the power indicated in the command. Power control compliance is typically tested and required before the client device is certified for use with the communication protocol.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 9 illustrates a flowchart according to various embodiments.

DETAILED DESCRIPTION

Figure 1:
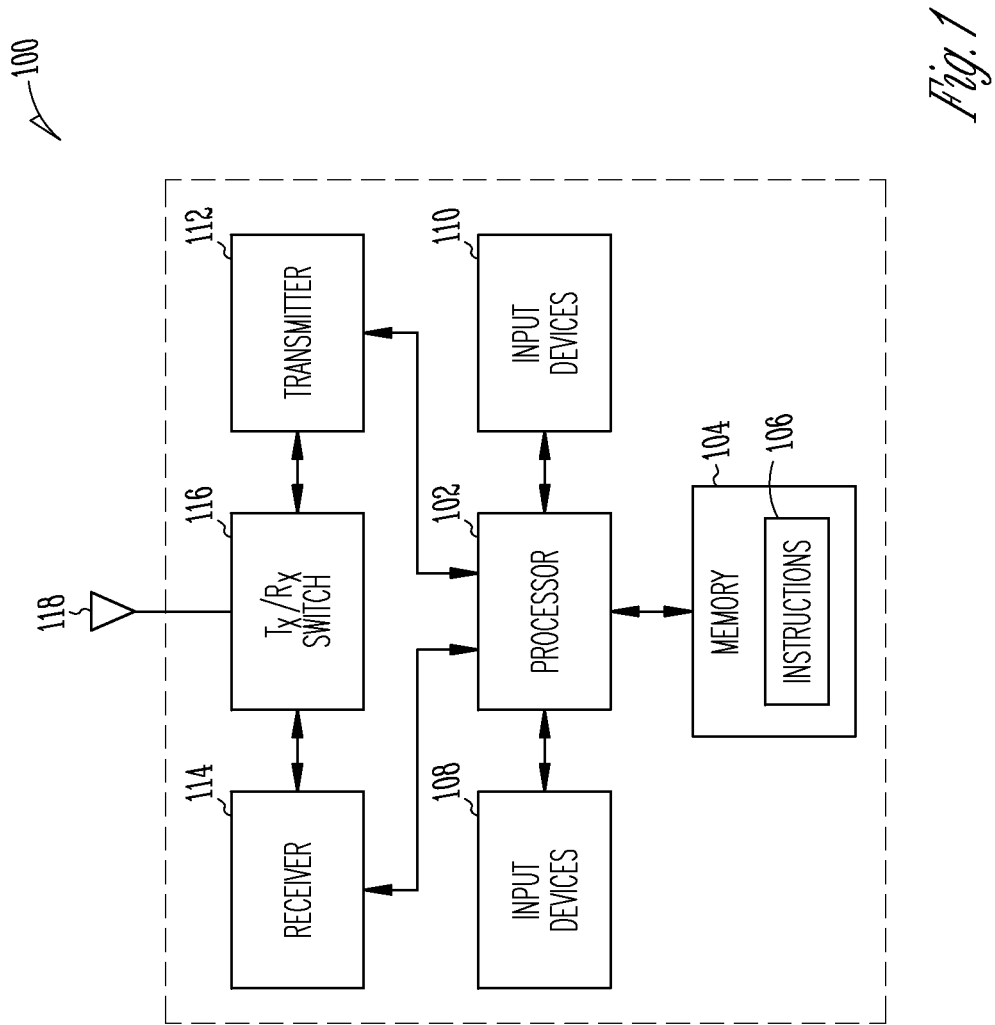
FIG. 1 illustrates generally an example of a wireless communication device that can be configured to implement the power control methods described herein.

Many power control techniques are open loop. In open loop control, the transmitter components are first calibrated to determine the power output of the transmitter that corresponds to certain gain settings for the transmitter components. Since a transmitter is composed of multiple components, and one or more of these components can have a configurable gain, there can be multiple gain settings to determine for a given power level. The calibration can result in a look-up-table (LUT) that maps a desired (or target) power level to the gain settings for the transmitter components that correspond to this power level. In use, when a desired power level is to be provided by the transmitter (e.g., in response to a command from a base station) the gain settings corresponding to that power level (e.g., obtained from the LUT) are applied to the transmitter components.

Power control techniques can also be closed loop. In closed loop control, the output power provided by the transmitter is measured and compared to a reference (e.g., a desired power level). If the output power is higher than the reference, the gain of the transmitter components is reduced, if the output power is lower than the reference, the gain of the transmitter components is increased. After the change in gain the power output is measured again and the gain is adjusted again if necessary. This control loop continues until the power output matches the reference; at which point the gain is held steady and the desired power output has been achieved.

There are a number of trade-offs to consider between open loop and closed loop control techniques. For example, closed loop techniques can provide more accurate power control since the closed loop techniques determine the gain settings based on the actual power output at the given time. Determination of the error calculation and gain settings for the closed loop, however, can be computationally intensive (e.g., speed and quantity of processing) since the driving factor of fast and precise control is the response time of the loop. In contrast, open loop techniques simply set the gain settings without the feedback loop. For an open loop technique to achieve the same power control accuracy and advantages of a closed loop design, however, the open loop design (in addition to having an extremely fast response time) would typically entail a good understanding of the response of the components in the transmitter across different operating ranges and operating environments. In some examples, this may include an infinite number of possibilities. A closed loop system, in contrast, takes these criteria into account automatically.

In addition to achieving an accurate output power, many transmitter designs consider the overall power consumption of the transmitter. A transmitter can consume a large amount of power, and reduction of transmitter power consumption can be important, particularly in wireless devices (such as cellular telephones) where the electronics receive power from an internal power pack (e.g., a battery). In general, approaches to reduce power consumption by the transmitter can include selecting/designing components of the transmitter that consume less power and selectively powering down the transmitter when not in use.

Various embodiments described herein recognize, among other things, transmitter power control methods that enable closed loop power control while reducing power consumption in the transmitter. In some examples, the power control methods provide settings to multiple components within the transmitter to improve the power amplifier efficiency (PAE) vs. output power (Pout) ratio. In addition to adjusting the gain of one or more components within the transmitter, in some examples, the power control methods adjust (set, change, supply, manage or otherwise monitor and/or control) the bias settings of the one or more components in order to further reduce the current consumption of the components. Similarly, in some examples, the power control methods adjust the magnitude of power provided to the power amplifier within the transmitter to reduce the power consumed by the power amplifier. In some examples, hybrid open loop-closed loop control methods are used, where some of the settings are set in an open loop manner and others are set in a closed loop manner. Finally, the power control methods enable a unified power control scheme for 2G, 3G, and 4G generation based wireless telephone technology devices (and may work well with other schemes as well).

FIG. 1 illustrates generally an example of a wireless communication device 100 that can be configured to implement various embodiments of the power control methods described herein. In various embodiments, the wireless communication device 100 includes a processor 102 coupled to a memory device 104 having instructions 106 thereon for execution by the processor 102. In general, "coupled" as used herein can refer to a physical relation of components such that one coupled component can send a signal, receive a signal, or both to/from another coupled component. Components that are coupled may be, but need not be, in physical contact with or proximate to one another. The instructions 106 can comprise software for implementing the functionality of the wireless communication device 100. For example, the software can cause the processor 102 to interact with an input device 108 (e.g., a mouse, keyboard, touch screen, microphone, camera, gyroscope etc.) and to interact with an output device 110 (e.g., a display, speaker, light, tactile output mechanism, etc.).

The software can also cause the processor 102 to send one or more control signals to the transmitter 112 and/or receiver 114. A switch 116 can control whether the transmitter 112 or receiver 114 are coupled to the antenna 118. The processor 102 can be "configured" to perform a function when the memory device 104 includes instructions 106 which, when executed by the processor 102, cause the processor 102 to carry out the function.

The wireless communication device 100 can be a portable or stationary device, and can be configured to operate in accordance with one or more frequency bands and with one or more standards profiles including a Global System for Mobile Communications (GSM), 3rd Generation Partnership Project (3GPP), 3rd Generation Partnership Project 2 (3GPP2), or an Institute of Electrical and Electronics Engineers (IEEE) standard. Example standards include an Enhanced Data rates for GSM Evolution (EDGE) (also referred to as Enhanced General Packet Radio Service (EGPRS)) standards profile, evolution-data optimized (EVDO) standards profile, a Worldwide Interoperability for Microwave Access (WiMAX) standards profiles (e.g., IEEE 802.16 standards), a WCDMA standards profile, a 3G HSPA standards profile, a Wi-Fi capable device (e.g., the IEEE 802.11 family of standards), and a Universal Terrestrial Radio Access Network (UTRAN) Long Term Evolution (LTE) standards profile. Examples of the wireless communication device 100 include a personal digital assistant (PDA), a desktop computer, a laptop computer, a tablet, a net-book, a wireless telephone, a wireless headset, a pager, an instant messaging device, a digital camera, an access point, a television, a medical device (e.g., a heart rate monitor, a blood pressure monitor, etc.), a set top box, etc. Moreover, in some examples, the wireless communication device 100 can be embedded within another device such as a television, vehicle, or other device.

Figure 2:
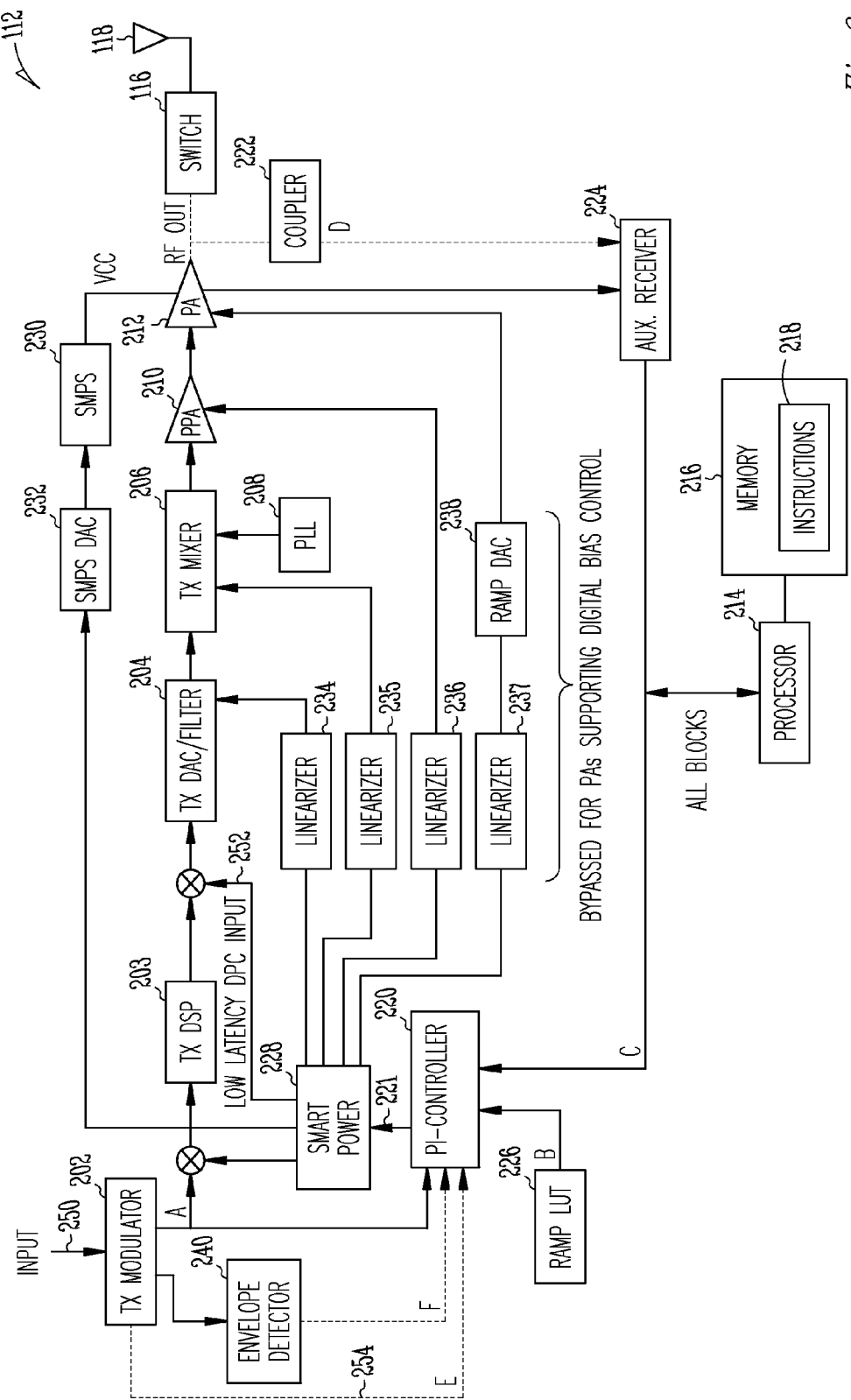
FIG. 2 illustrates generally an example of various embodiments of a transmitter that can be configured to implement one or more of the power control methods described herein.

FIG. 2 illustrates generally an example of a transmitter 112 that can be configured to implement the power control methods described herein. The transmitter 112 can include a modulator 202 that can receive information to be transmitted at input 250 and modulate the information to produce complex (I/Q) numbers corresponding to constellation symbols. The complex numbers can be processed with a digital signal processor (DSP) 203 in accordance with the given transmission scheme. A digital to analog converter (DAC) 204 can convert the complex numbers to analog waveforms and pass the analog waveforms to a mixer 206. The mixer 206 can produce a modulated radio frequency (RF) signal at the RF carrier frequency using a local oscillator generated from a phase locked loop (PLL) 208. The modulated RF signal can be amplified with a pre-power amplifier (PPA) 210 and a power amplifier (PA) 212. The output of the PA 212 can be coupled by the switch 116 to the antenna 118 for radiation to another wireless communication device.

The transmitter 112 can also include a processor 214 coupled to a memory 216 having instructions 218 thereon to control the power of the modulated RF signal radiated from the antenna 118 in an open loop manner. Although the processor 214 and memory 216 are shown and described herein as dedicated components within the transmitter 112, in other examples, the functions of processor 214 and memory 216 can be implemented with a non-dedicated processor and memory outside of the transmitter 112 (e.g., processor 102 and memory device 104 of FIG. 1). In an example, the processor 214 can include a microprocessor, a general purpose processor, a digital signal processor, or some other processing device.

To control the output power (e.g., the power of a signal that is output) from the PA 212, the processor 214 can set an initial power level of the transmit signal by multiplying a power input with the transmit signal in an open loop manner. For example, based on a command from a base station, an output power level for the transmitter 112 can be determined. As a function of that output power level, the initial power level of the transmit signal can be set. For example, in a basic open loop, the power gain across the DAC 204, mixer 206, PPA 210, and PA 212 is held constant such that two signals of the same initial power level input into the DAC 204 are output from the PA 212 at the same power level. In this basic open loop, the power level of the output signal can be changed by changing the initial power level of the transmit signal. In some examples, the initial power level is set by multiplying the power input with the transmit signal prior to the DSP 203 and in other examples, the power input is multiplied with the transmit signal after the DSP 203.

For the open loop power control, the processor 214 determines the settings for the power input signal based on a predetermined power value corresponding to the power command provided by the base station. These predetermined power values can be determined from a characterization of the transmitter 112 prior to commercial use. Accordingly, these power values do not change, or at least not very frequently, during operation of the transmitter 112. Additionally, since these values are set in an open loop manner, these values are not based on the current actual output power from the transmitter 112. Instead, as mentioned previously, the power values are set based on the characterization of the output power prior to commercial use.

The processor 214 can also control the gain, the bias, or both the gain and the bias of the individual components of the transmitter 112. In an example, the individual components under control of the processor 214 can include the DAC 204, the mixer 206, the PPA 210, and the PA 212. For open loop control, the components can be controlled in the same manner as the initial power level of the transmit signal is set. For example, based on a power command from the base station, the processor 214 can determine an output power for the transmitter 112. As a function of this output power, the processor 214 can set the gain or bias, or both, of one or more of the components of the transmitter 112. Similar to setting the initial power level, the processor 214 can determine or adjust the gain or bias settings, or both, for the transmitter components based on a predetermined power value stored in a look-up-table. The predetermined power value can be determined from a characterization of the transmitter 112 prior to commercial use.

Setting a gain for an individual component is not limited to any particular technique, and in various embodiments is accomplished for example by setting a programmable gain in an individual component. In various embodiments, the gain of an individual component is set by one or more hardware components coupled to the individual component, and wherein the electrical parameters of the one or more hardware components can be varied in order to adjust the gain of the individual component. In general, a bias is required to be applied to one or more inputs of an amplifier in order for the amplifier to operate. By way of a non-limiting example, a bias is applied to the inputs of an operational amplifier in order for the operational amplifier to properly operate. By setting the bias for an individual component, certain electrical parameters of the individual component, such as gain and/or power consumption, or both, are determined. By changing the bias applied to the individual component, the electrical properties, including but not limited to gain and/or power consumption, or both can be changed for the individual component. In various embodiments, a current bias is applied to an individual component, and the current bias can be altered in order to adjust a bias applied to the individual component. In various embodiments a voltage bias is applied to the inputs of an individual component, and the voltage bias can be varied or changed in order to adjust the bias applied to the individual component.

A common method of characterization is measurement of output power for each gain and bias setting (or a selected few) over multiple parts over various temperatures and frequencies and then fitting a mathematical function on the data. The mathematical function could be implemented together with a LUT based entries, whereby a multi-dimensional LUT provides the values that are used to interpolate for the desired output power level. At the time of use, knowing the frequency and temperature, the correct setting can be determined and applied to force the output power to the desired value. This can be an expensive process and prone to errors. The accuracy is dependent on the accuracy of the model of used to determine the settings that are applied to provide the desired output power. The transmitter device used may also be different from the devices that were used to obtain the characterization data. It is possible that any errors in the output power cannot be corrected if the mathematical model has limitations and the devices operate in the region where the model is inaccurate.

In some examples, the transmitter 112 can also control the power in a closed loop manner. For example, a proportional-integral (PI) controller 220 can determine the current output power for the PA 212 by comparing the current output power to a desired output power and generating an error signal. Based on the error signal, one or more of the input power level of the transmit signal, and the gain or bias, or both, of one or more of the components can be adjusted in order to move the current output power closer to the desired output power. This control loop can happen numerous times within a single desired power change until the current output power settles at the desired output power.

In an example, the PI-controller 220 can determine the current output power from the PA 212 by measuring the current output power with an auxiliary receiver 224. The auxiliary receiver 224 can provide a digital signal indicative of the output power at the PA 212. In an example, the auxiliary receiver 224 can receive an analog indication of the output power from a coupler 222. More detail regarding the coupler 222 and the auxiliary receiver 224 will be provided with respect to FIG. 4.

The PI-controller 220 receives the digital signal indicative of the output power and compares a value indicative of the current output power to a value indicative of a desired output power. In an example, the value indicative of the current output power can be derived from the digital signal and the value indicative of the desired output power can be derived from a ramp look-up-table 226. For example, the value indicative of the desired output power can be read from the ramp look-up-table 226.

As discussed above, in some examples, the desired output power is determined based on a power command from a base station. For example, the base station can command a specific output power for the transmitter 112. In another example, the processor 214 can determine a desired output power based on other considerations (e.g., a low quality of a received signal). In any case, the desired output power can be a large enough change from the current output power that the power output of the PA 212 is ramped in multiple steps from the current output power to the desired output power. This ramping of the output power can be accomplished by using the ramp look-up-table 226. For example, the desired output power (e.g., the output power provided by the base station) can be received at the PI-controller 220 from the processor 214, and the PI-controller 220 can treat this desired output power as a final power to be ramped up to in a plurality of smaller steps. The power values for each step can be obtained from the ramp look-up-table 226. The value for the current step can be applied by the PI-controller 220 as the desired output power such that the value for the current step is compared to the current output power and one or more of the initial power level of the transmit signal, and the gain or bias or both of one or more of the components can be adjusted until the current output power settles on this value for the current step. Once the current output power settles on the value for the current step, the PI-controller 220 updates the desired output power to the value of the next step from the ramp look-up-table 226. Updating the desired output power restarts the loop, such that adjustments are made until the current output power again settles on this updated desired output power. Updating of the desired output power continues through each step until the desired output power has reached the value provided by the processor 214. This process enables the output power to be ramped to the desired output power to reduce spurious emissions from the PA 212.

During closed loop control, settling the output power on a given desired power value involves many iterations of the loop. As discussed above, the loop includes the PI-controller 220 comparing a value indicative of the current output power to a value indicative of a desired output power. The PI-controller 220 then provides an error signal to the smart power block 228. The smart power block 228 applies settings to the components of the transmitter 112, to the transmit signal in order to achieve the desired output power at the PA 212, or both. To apply settings to the transmit signal, the smart power block 228 can multiply the transmit signal by a gain value either before or after the DSP 203. To apply settings to the components, the smart power block 228 can set the gain or bias or both of the DAC 204, the mixer 206, and the PPA 210. The smart power block 228 can also adjust the component settings by setting either the bias of the PA 212 or the power supply voltage for the PA 212, or by setting both the bias and power supply voltage. In an example, the power supply voltage for the PA 212 can be set by setting a switched mode power supply (SMPS) 230 to output a desired voltage to the PA 212. In some examples, a DAC 232 can convert a digital value provided by the smart power block 228 to an analog signal for setting the SMPS 230.

The smart power block 228 can apply the settings for open loop control, closed loop control, or both. When the smart power block 228 applies the settings for open loop control, the smart power block 228 can, for example, receive the settings from the processor 214 and apply the settings. When the smart power block 228 applies the setting for closed loop control, the smart power block 228 can receive the error signal from the PI-controller 220 and determine the settings to apply to one or more of the input power level of the transmit signal, and the gain or bias or both of one or more of the components. In an example, the closed loop power control generates monotonic output power with the digital control.

In some examples, some settings can be controlled in an open loop manner, while other settings are controlled in a closed loop manner. For example, the initial power level can be set in an open loop manner (e.g., settings determined by the processor 214), while the settings for the components of the transmitter 112 can be set in a closed loop manner, based on the error signal from the PI-controller 220.

In a completely closed loop scheme the initial power level as well as the settings for the components are set based on the error signal from the PI-controller 220. Here, the smart power block 228 receives the error signal from the PI-controller 220 and determines the value to multiply the transmit signal by for the input power level. The smart power block 228 also determines the settings for the components based on the error signal. For example, the smart power block 228 determines the bias and gain for the DAC 204, mixer 206, and PPA 210. The smart power block 228 also determines the bias for the PA 212 and the power supply value for the PA 212.

In an example, an error signal below a threshold (e.g., when the error signal is near zero) indicates that the current output power is at the desired output power. Accordingly, when the error signal is below a threshold, the smart power block 228 maintains the current settings for the initial power level and the components in order to maintain the output power at the desired output power. An error signal that is a positive value or negative value above the threshold indicates that the current output power is above or below the output power. Accordingly, when the error signal is a positive or negative value above the threshold, the smart power block 228 adjusts the current settings for one or more of the initial power level and the components in order to adjust the output power towards the desired output power.

The smart power block 228 can appropriately partition the power control settings between the input power level and the components. In an example, the smart power block 228 sets the initial power level and the gain and bias of the components, as well as the power supply voltage of the PA 212 in order to achieve the desired output power while using the least amount of power. Since the settings are controlled in a closed loop manner, the smart power block 228 does not need to know or determine the settings for the input power level and the components. Instead, the closed loop automatically settles on the appropriate settings for the initial power and the components by having the smart power block 228 adjust the settings based on the error signal. As mentioned above, it may take many adjustments by the closed loop before the loop settles at the desired output power.

For closed loop operation, the transmitter 112 can also include a plurality of linearizer LUTs 234-237 for linearizing the settings applied to the components. As shown in FIG. 2, the smart power block 228, after receiving the error signal from the PI-controller 220 can partition settings to one or more of the components. Each of these settings can be passed through a linearizer LUT 234-237. The respective linearizer LUT 234-237 can then provide the bias setting, gain setting, or both to the respective component based on the setting from the smart power block 228. For example, the smart power block 228 can provide a power setting to the linearizer LUT 234, and the linearizer LUT 234 can convert the power setting to a gain setting and bias setting for the DAC 204. Thus, in an example, for a single value provided to the linearizer LUT 234, both a gain and a bias setting are provided to the DAC 204. The linearizer LUT 234 can help to provide gain and bias settings the DAC 204 that produce a monotonic response by the DAC 204, and thus remove non-linearities from the control loop. Linearizer LUT 235 and linearizer LUT 236 can provide functions similar to the linearizer LUT 234 except for the mixer 206 and the PPA 210 respectively. For example, for a value received at the linearizer LUT 235 from the smart power block 228, the linearizer LUT 235 can provide a gain setting, a bias setting, or both to the mixer 206. Similarly, for a value received at the linearizer 236 from the smart power block 228, the linearizer LUT 236 can provide a gain setting, a bias setting, or both to the PPA 210. The linearizer LUT 237 can provide a bias setting to the PA 212 based on a value from the smart power block 228. Similar to the linearizer LUT 234, the linearizer LUTs 235, 236, and 237 can help provide values to the mixer 206, PPA 210, and PA 212 that produce a linear response by those components. Thus, the linearizer LUTs 235, 236, 237 can help remove non-linearities from the response of the components in the control loop. In an example, the bias setting from the linearizer LUT 237 is adjusted by a DAC 238 to provide a ramped bias change for the PA 212. In another example, the PA 212 bias input is digital and the output from the smart power block 228 is provided directly to the PA 212, since the linearizer 237 and ramp DAC 238 are not needed.

In an example, the smart power block 228 converts the error signal from the PI-controller 220 to a digital control word for setting the gain, bias, or both of a particular component. The smart power block 228 implements the function of mapping of the error to a valid code that controls the power consumption of the component while providing the gain function. Since the implementation maps the error signal to a certain finite representation, the space represented by the error signal is mapped to regions, each corresponding to a valid digital setting of the component. The bias and gain control settings of a block are provided by the linearizer LUTs while the desired output gain is applied at the input (address). The output versus input is designed to be monotonic such that higher gain is provided with higher input. The bias settings of the component are selected such that bias is increased only when the desired gain cannot be achieved with the current bias value. Hence, the desired gain is provided with smallest bias current, while not violating the monotonicity of output versus input. This is essential requirement to avoid oscillatory behavior in the closed loop operation.

There are several methods of performing the mapping of the error signal to a digital control word. In one example, the PI-controller 220 can provide an output between +1 and −1. Assuming the component being controlled has four gain settings and four bias settings, the smart power block 228 can output the following control words: For an error signal between −1 and −0.5, the smart power block 228 can output a control word of "00" which corresponds to the lowest gain and the lowest bias setting for the component. For an error signal between −0.5 and 0, the smart power block 228 can output a control word of "01" corresponding to the 2nd lowest gain and bias settings. For an error signal between 0 and 0.5, the smart power block 228 can output a control word of "10" corresponding to the 2nd highest gain and bias setting. For an error signal between 0.5 and 1, the smart power block 228 can output a control word of "11" corresponding to the highest gain and bias settings.

The gain and bias settings are mapped such that as the gain is increased to produce a higher output power, the current consumption of the component is also increased. Accordingly, the most positive error signal (e.g., when the output power is much smaller than the reference power level) selects the highest gain in order to produce a higher output power and also selects the highest bias setting in order to enable the components to produce the highest gain. The most negative error signal (e.g., when the output power is much greater than the reference power level) selects the lowest gain and bias settings in order to produce a lower output power while reducing current consumption to only that needed to produce the output power.

It should be understood that the above mapping is only an example to demonstrate the principle, and other mappings can be used. Moreover, in some examples, the mappings of the smart power block 228 can be modified in an open loop manner by the processor 214. For example, the processor 214 can adjust the mappings of the smart power block 228 based on the operating environment including measurements such as a temperature of a die (e.g., the die comprising the PA 212). Moreover, the processor 214 can determine that certain bias settings do not produce satisfactory performance and remove or adjust those bias settings. Additionally, in some examples, the processor 214 can override the closed loop control and set the bias, gain, or both settings for one or more of the components in an open loop manner. Thus, with some settings set by the processor 214 in an open loop manner, the remaining settings can be set by the closed loop control. This can be advantageous, for example, in order to simplify the closed loop and help the closed loop settle on a particular value for the remaining gain and bias settings.

As mentioned above, in closed loop control the smart power block 228 can determine settings based on an error signal from the PI-controller 220. The PI-controller 220 can determine the error signal based on a comparison between an indication of the output power and a reference power. The PI-controller 220 can also receive the signal from the modulator 202. In an example, if the transmitter 112 is in a 2G based or a Time Division Synchronous Code Division Multiple Access (TDSCDMA) mode, during ramping of the output power, the modulator 202 produces a continuous wave (CW) signal. Accordingly, in the 2G and TDSCDMA modes, the PI-controller 220 can receive the CW signal directly. In some examples, however, the PA 212 can be ramped on a modulated signal. For example, when the transmitter 112 is in a Wideband CDMA (e.g. Chinese 3.5G wireless standard) WCDMA or a Long Term Evolution (e.g. 3GPP2 4G wireless standard) LTE mode. When the PA 212 is ramped on a modulated signal, the modulated data can be made available to the PI-controller 220. For example, the modulated signal from modulator 202 can be sent to the envelope detector 240. The envelope from the modulated signal can be extracted by the envelope detector 240 and sent to the PI-controller 220. The PI-controller 220 can then delay match the envelope signal from the modulator with an envelope signal from the auxiliary receiver 224. The envelope signal can be multiplied by a ramp signal from the ramp look-up table 226 to produce a reference signal. In these examples, the error signal can comprise a ramp signal multiplied by the envelope of the modulator 202 minus the envelope of the current output signal. In an example, the delay matching of the envelope signal from the modulator 202 and the envelope signal of the output power can be done as a calibration step to ensure that the envelope of the signal from the modulator 202 and the envelope from the output signal are time aligned and that the envelope of the output signal is not a time delayed version of the envelope of the modulated signal.

In an example, the closed loop system has a fast response time in order to achieve a desired accuracy and in order to appropriately settle on the desired output power. For this reason, in some examples the closed loop control components (e.g., the PI-controller 220 and the smart power block 228) are implemented with logic elements (e.g., a field programmable gate array (FPGA)) instead of a processor. In some examples, the closed loop can respond to an output power measurement within 10 to 50 microseconds. Moreover, in some examples, the closed loop operation requires direct access to the gain and bias settings without intervening hardware (e.g., without register access) that would slow down the response time. Slowing down the response time can create potential instability in the operation of the loop. In some examples, if a setting cannot be updated with a fast enough response, the value should be set by the processor 214 and not controlled by the error signal of the PI-controller 220. In an example, the closed loop system can operate at a speed of 52 to 78 MHz. Additionally, in order to perform low latency adjustments during closed loop operation, closed loop power control adjustments can be made after the DSP 203 and before the DAC 204 in the transmit chain.

In an example, the coupler 222 includes a voltage detector output embedded inside the PA 212. In another example, the coupler 222 includes a wideband direction or non-directional coupler (e.g., a wire trace) at the output of the PA 212 that feeds to the auxiliary receiver 224. When a non-directional coupler is used, the forward power can be estimated by estimating the voltage standing wave ratio at the PA 212 output.

Figure 3:
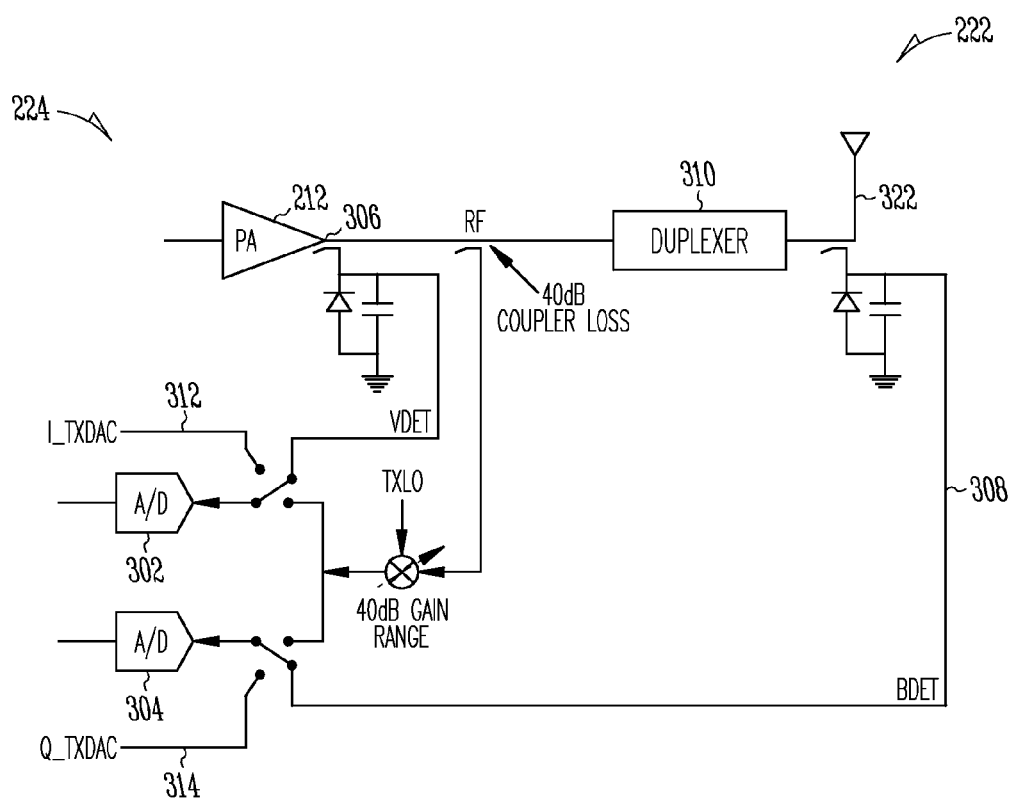
FIG. 3 illustrates generally an example of an auxiliary receiver and coupler.

FIG. 3 illustrates generally an example of an auxiliary receiver 224 and coupler 222. The auxiliary receiver 224 can include a first analog to digital converter (A/D) 302 and a second A/D 304. Distortions that present themselves in the feedback path are difficult to suppress with the control loop. In particular, gain variation over temperature is a major degradation that can add uncertainty to the estimate of output power. The degradations in the receive path can be tracked and compensated. This is possible by characterizing data and fitting a curve on gain versus temperature. By reading an on-chip temperature sensor output, the gain of the auxiliary receiver 224 can be compensated by applying a mathematical correction.

In another example, variation in the auxiliary receiver 224 can be compensated for by using a voltage detector (VDET) output 306 in the PA 212. This VDET output 306 can be passed through the first A/D 302. In an example, this VDET output 306 can be used at high output powers to provide accurate power estimates. The gain of the auxiliary receiver 224 can then be adjusted to the accuracy of the VDET output 306 at a power level where VDET is accurate. At lower power levels, the aux-RX output will inherit the same accuracy.

In some examples, the error in gain in the feedback path cannot be completely corrected by the closed loop control, and the error will appear as an error in the output power, even when the loop error is zero. The VDET output 306 can be used to improve upon this error to the accuracy of the VDET output 306.

The first and second A/D 302, 304 can be selectively coupled to different inputs that can be used to determine the output power of the transmission signal. As mentioned above one input includes the VDET output 306 from the PA 212 to the first A/D 302. At the same time as the VDET output 306 is sent to the first A/D 302, the BDET output 308 which provides the signal after the duplexer 310 and at the antenna 322 can be coupled to the second A/D 304. The BDET output 308 includes the transmission signal; however, it can also receive the received signal together with blockers. Another input at the A/Ds 302, 304 can include the I and Q output 312, 314 respectively from the DAC 204. Still another input at the A/Ds 302, 304 can include the RF signal from the PA 212.

In an example, the coupler 222 can be embedded in the PA 212. For example, the VDET output 306 can be accurate at high output power and quite inaccurate around the cutoff voltage of the diode. Generally, for example, the VDET output 306 can exhibit a pole in the 7-10 Mhz range.

An additional method for eliminating the distortion created in the receiver is to use an independent PLL for the receiver. The receiver can be operated in low-IF mode and will convert the measured power to an IF tone. The offsets added in the receive path will appear as a DC term. A second digital down-conversion can follow to translate the IF tone to DC while translating the DC offset added in the receiver to the IF frequency. A simple low pass filter can now be used to isolate the desired signal from the undesired DC offset added in the receiver. This method will provide the measured output power without having any distortion added from the measuring receiver over low powers. However, the filter used to isolate the measured power from the DC offset added in the receiver will add delay to the control loop which may need to be compensated in the control loop.

In examples where the coupler 222 is non-directional, power estimation is on the sum of delivered and reflected power. In examples where the coupler 222 is directional, the average delivered power will be provided. The coupler 222 cannot track fast modulation accurately over peaks and valleys with a simple diode/capacitor. The coupler 222 can produce an average power estimate depending on the pole location of the low pass filter at the output of the diode. Modulation can be tracked, however, by the auxiliary receiver 224.

In operation of the closed loop power control, the transmitter 112 operates in closed loop with a base-station receiver which sees the delivered power through the communication channel, thus helping avoid the need for use of a directional coupler in the PA 212. The base station sends the power up or down commands, which creates the outermost power control loop, despite the fact that the local power control loop in the handset is operating off of the sum of delivered and reflected power at the antenna. If the transmitter 112 could close its loop using the delivered power only, it may be advantageous as the output power at the antenna could be reported to the base-station to help establish the quality of the channel more accurately and/or tune an adaptive antenna.

Figure 4:
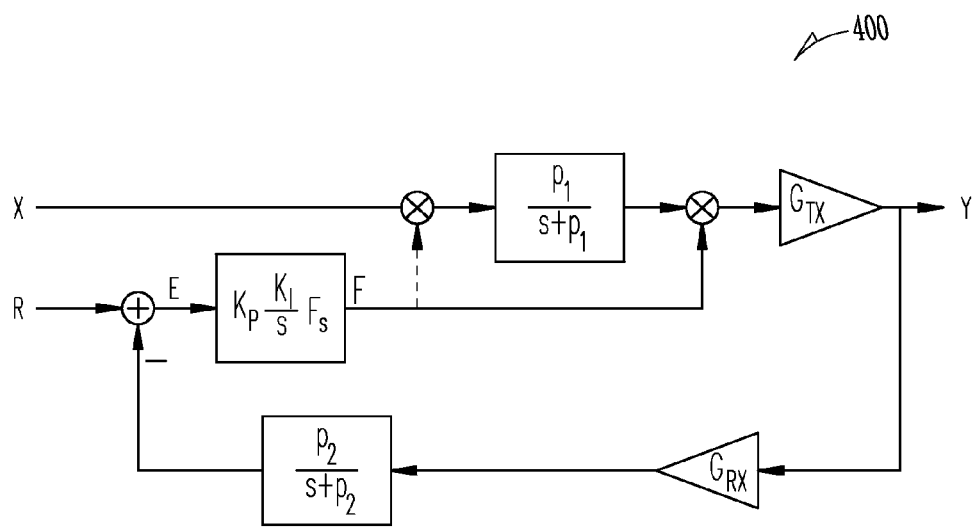
FIG. 4 illustrates a simplified model of a closed loop operation in s-domain.

FIG. 4 illustrates a simplified model 400 of a closed loop operation in s-domain. In model 400 two cases are considered. When the gain of the transmitter is controlled by adjusting the bias and gain settings of one or more of the components, the modulation X is applied to the DAC/LPF transfer function directly. The power is completely controlled by analog gains. The output of the transmitter during this "analog" gain control is given as:

$$Y(s) = G_{TX} \frac{K_p s^2 + (K_p p_2 + F_s K_1)s + K_1 p_2}{s^2 + (p_2 + G_{TX} G_{RX} K_p p_2)s + G_{TX} G_{RX} F_s K_1 p_2}$$

Figure 5:
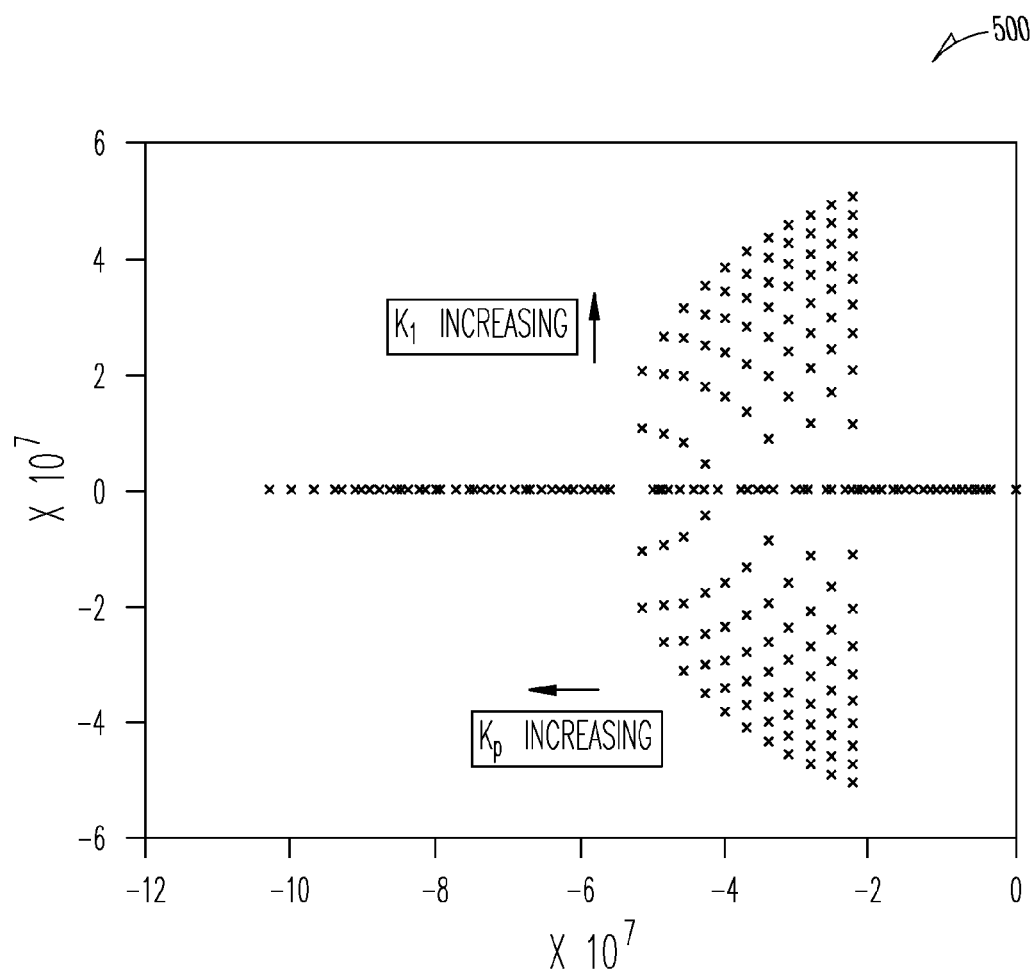
FIG. 5 illustrates a root locus plot corresponding to the "analog" gain control.

FIG. 5 illustrates a root locus plot 500 corresponding to the "analog" gain control (data obtained via simulation). As shown in the plot 500, the closed loop operation during "analog" gain control is stable. When the gain of the transmitter is controlled entirely through closed loop operation by adjusting the signal input into the DAC 204, the closed loop transfer function is given as:

$$Y(s) = G_{TX} \frac{p_1 K_p s^2 + p_1(K_p p_2 + F_s K_1)s + F_s K_1 p_1 p_2}{s^a + (p_1 + p_2)s^2 + (p_1 p_2 + G_{TX} G_{RX} K_p p_1 p_2)s + G_{TX} G_{RX} F_s K_1 p_1 p_2}$$

Figure 6:
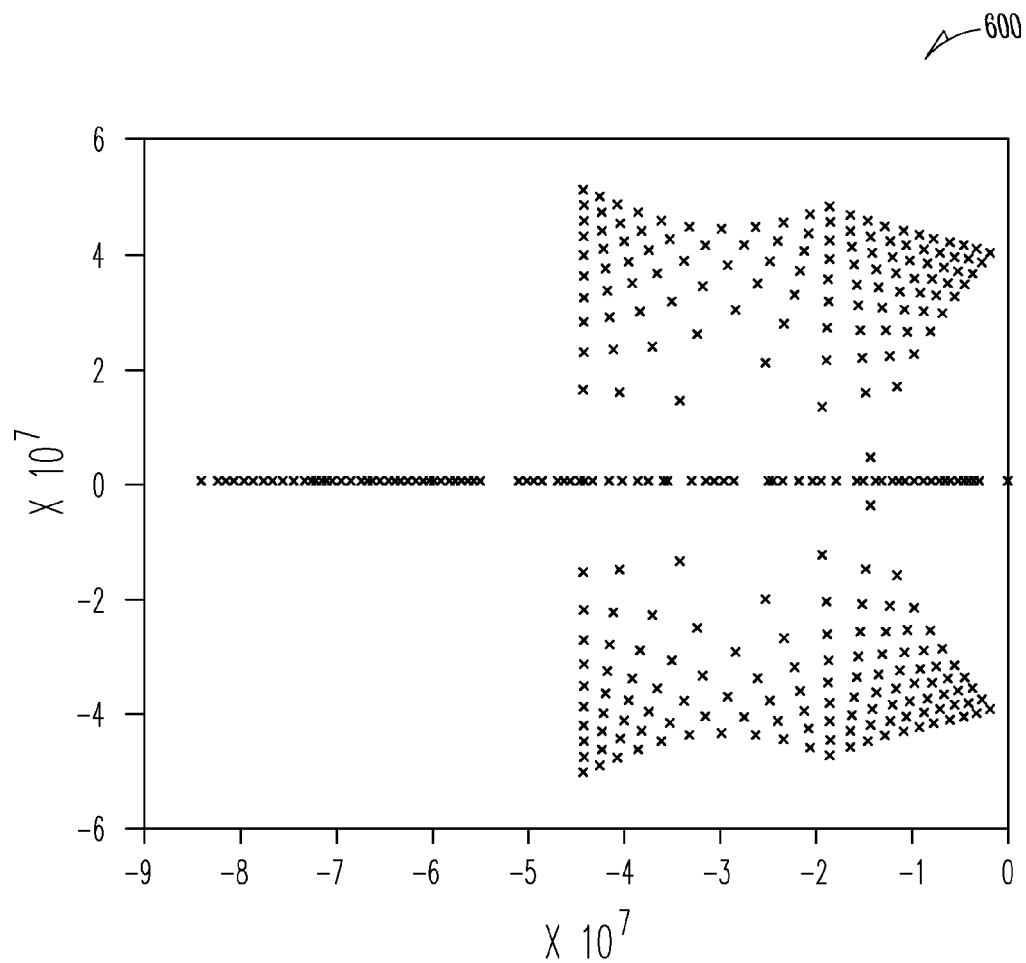
FIG. 6 illustrates a root locus plot corresponding to adjusting the gain at the input of the DAC.
Figure 7:
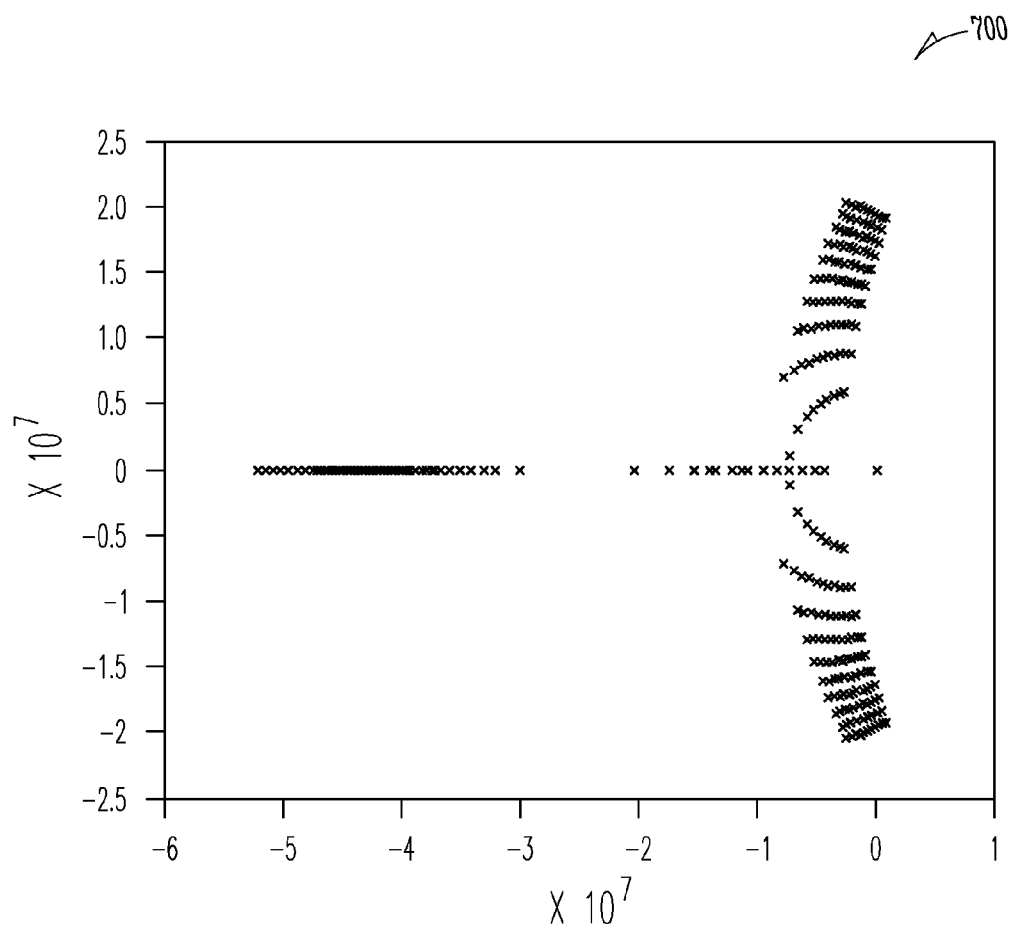
FIG. 7 illustrates a root locus plot for $p_f=500$ KHz.

FIG. 6 illustrates a root locus plot 600 corresponding to adjusting the gain at the input of the DAC 204 (data obtained via simulation). Plot 600 is given for Kp and Kl ranging between 0 and 1 in increments of 0.1, $G_{TX}$=40, $G_{RX}$=1/30, Fs=52 MHz, $p_f$=7 MHz. FIG. 7 illustrates a root locus plot 700 for $p_f$=500 KHz. Both the plot 600 and 700 are stable (data obtained via simulation).

Figure 8:
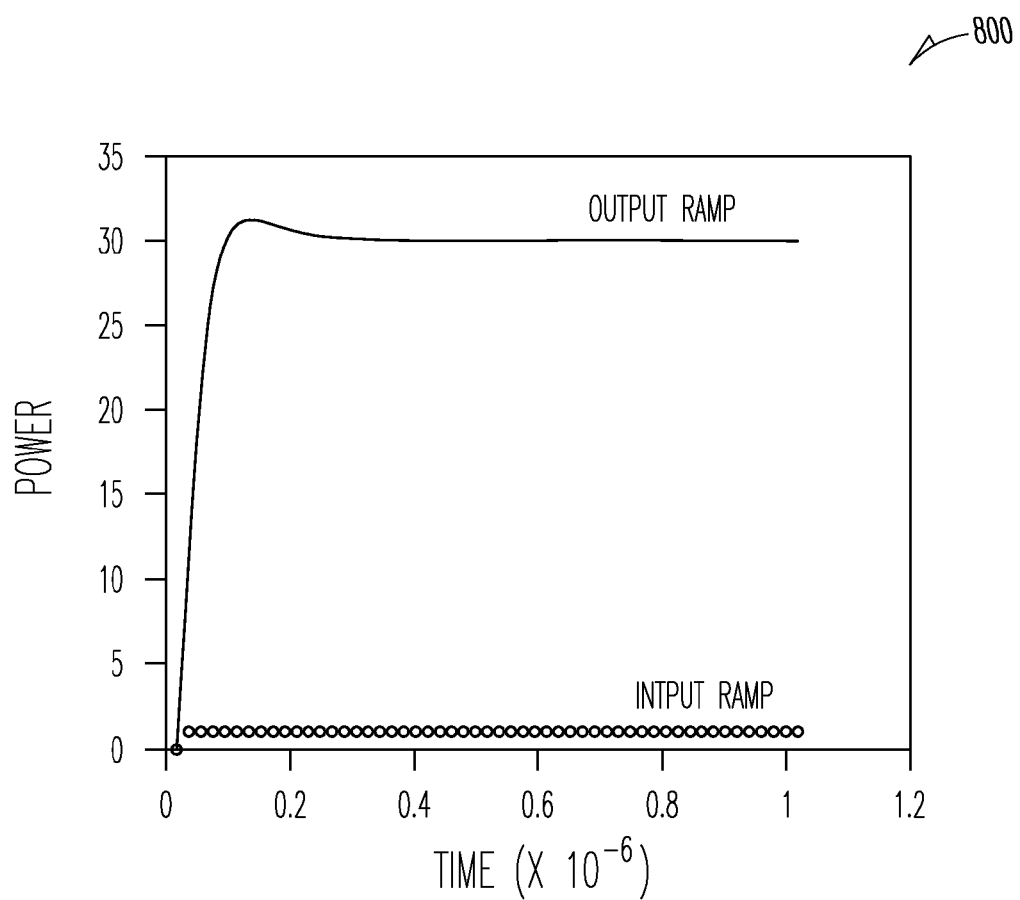
FIG. 8 illustrates a test transmitter output power curve.

FIG. 8 illustrates a test transmitter output power curve 800 (data obtained via simulation). The curve 800 corresponds to a unit step response of closed loop power control with Kl=1 and Kp=0.6. Overshoots in the curve can be reduced by changing Kp based on the estimated gain. If the analog gain is too high, overshoots are more easily generated and Kp can be reduced. If closed loop is used to reduce the gain by reducing power consumption, Kp can be left alone.

Referring again to FIG. 2, various embodiments of closed loop mode operations are described in further detail. In various embodiments, modulator 202 output at node A is coupled to DSP 203, and is passed on to the following analog circuits DAC 204, mixer 206, PPA 210 and PA 212. The baseband detection is complex (UQ) based. The DAC 204 converts digital signals to analog signals. The mixer 206 mixes the modulated signal to the radio frequency (RF) carrier frequency through the LO generation from PLL 208. The modulated RF signal is amplified through PPA 210 and subsequently sent on to PA 212 for further amplification. The output from PA 212 is coupled through a coupler 222, and fed back through auxiliary receiver 224 acting as a feedback mechanism to node C. The coupler 222 is not limited to any particular type of coupler, and can be implemented in various ways, including but not limited to inductive coupling through parasitic trace on the printed circuit board, resistive coupling, or one of many other methods available. The coupler can be directive to allow accurate output power control over varying VSWR conditions at the antenna. Non-directional coupler will indicate power levels that would have a standing wave element. The standing wave can be determined by recording the output power by the processor 214.

In various embodiments, during ramping the modulator 202 produces a continuous wave (non-modulated) signal, which can also be the case in 3G power changes. The auxiliary receiver 224 converts the RF signal it receives to a baseband signal. In various embodiments, the feedback mechanism is an auxiliary receiver, and the baseband signal is a complex signal). The auxiliary receiver 224 then extracts the envelope information and provides the envelope information to the PI-controller 220. The ramp shape that is desired to guide the output power transition is provided by ramp look-up table 226 and supplied at node B. The PI-controller 220 implements a proportional and integral controller in discrete-time domain. If the signal C is equal to signal B, the error (E) can go to zeros and integral term gets fixed to the value that forces the signal at node C to be equal to the desired value at node B.

"Equal" in these descriptions is understood as substantially equal, and does not require or is not limited to being exactly equal to an infinite number of measureable decimal places, but equal to the extent required or as would be understood by one of skill in the art relative to the operation(s) being described.

The smart power block 228 converts the error signal to a digital control word that selects the gain of a particular block. Hence, the smart power block 228 implements the function of mapping of the error to a valid code that selects the gain & bias current (or power consumption) of an element (e.g. DAC/Filter, mixer, etc.). Since the implementation maps the error signal to a certain finite representations, the space represented by the error signal is mapped to regions, each corresponding to a valid digital setting of the block.

There are several ways to do such mapping. One simplest mapping is shown in Table 1. In this illustrative example, the PI-controller 220 has an output (PI Out) 221 that is represented to be between +1 and −1 through fixed-point implementation. In this example illustration, it is assumed that the element being controlled has four gain settings and four bias settings. However, the number of gain settings and bias settings is not limited to these particular settings, or to a particular number of settings.

TABLE 1

| PI Out value | Gain | Power Consumption |
|---|---|---|
| 0.5 to +1 (or most positive) | Code = 11 (highest gain) | Code = 11 (highest current) |
| 0.0 to 0.5 | Code = 10 (mid gain) | Code = 10 (mid-current) |
| −0.5 to 0 | Code = 01 (next higher gain over lowest) | Code = 01 (next higher gain over lowest current) |
| −1 to −0.5 (or most negative) | Code = 00 (lowest gain) | Code = 00 (lowest current) |

As shown in Table 1 the four gain setting codes are mapped such that most negative error selects the lowest gain (that is, C is much greater than B, and the output power needs to be reduced). In this illustrative example, the bias currents are also mapped such that the current consumption of the element is reduced progressively as the desired gain is reduced. This example merely demonstrates the principle. The mapping can be changed by the processor based on operating environment or external measurements such as temperature of the die, where it is known that certain bias settings do not produce satisfactory performance and those are eliminated from the mapping table.

In various embodiments, the smart power block 228 also allows certain digital settings to be never used. As an example, if a mid-current setting is selected for all possible PI Out values, the smart power block 228 will fix the bias current to a predetermined value and effectively makes it open loop. The mapping can also be changed between 2G, 3G and 4G standards for a multi-mode transmitter. By changing the entries of the LUT, the behavior of the power control loop can be changed.

Based on operating environment or external measurements such as temperature of the die, these tables may be updated by the processor to obtain a more desirable performance.

Sometimes amplifiers are implemented with many gain settings and can be interpreted as a D/A converter on gain. Hence, they have INL and DNL in gain versus code. In various embodiments, the purpose of linearizer LUTs 234-237 are to linearize the gain versus input code when combined with the amplifier, if desired. The most useful function of the linearizer LUTs is to ensure that the gain versus code remain monotonic function, i.e. progressively higher codes produce progressively larger gain and vise versa.

Linearizer LUTs are optional, if the amplifier gain is a monotonic function of applied gain. We show them for the purpose of completeness.

In various embodiments, the processor also directly selects some gain and bias settings and configures the control loop such that it does not change the processor set controls and only forces the error to go towards zero through the remaining controls available to it.

Ramp Through the Power Supply

Table 1 also illustrates the possibility of applying a power ramp through the control of VCC (see FIG. 2). The desired gain is set based on the peak-to-average power ratio of the TX modulation waveform. The power supply is increased by the PI-control loop progressively until the error goes to zero. As the modulation is applied now, the loop has set the PA VCC to the lowest setting needed to produce the desired output power completely autonomously. This is in contrast with a second approach that needs characterization to be able to design look-up table entries versus different temperatures to apply the output power control in an open loop manner.

It is also possible to have a dedicated power control loop for the SMPS DAC 232 while having a second control loop for controlling the bias and gain of all other analog blocks in the transmitter. Hence, a dedicated PI-controller 220 will use the signal from the feedback signal and compare it with the reference. Once the output VCC is set to the desired level with a closed loop operation of the second control loop, the first control loop operation follows and adjusts the gain to provide desired output power.

It is possible to ramp up and down while modulation is taking place (i.e. no dedicated times when CW signal is transmitted). In this embodiment, the TX modulation data is made available to the PI-controller (dashed line 254 from modulator 202 to PI-Controller, node E in FIG. 2) while the feedback mechanism consisting of an I/O based receiver extracts the envelope from the feedback signal and presents to the PI-controller as shown in FIG. 2.

The envelope from the modulator 202 is extracted and delay matched to the envelop signal form the auxiliary receiver 224. The signal F is then multiplied with the ramp signal B to produce the new reference signal. In this configuration, the error signal is note B*F−C and is processed by the PI-controller 220.

This allows closed loop operation during modulation. The delay matching of F and C can be done as a calibration step to ensure that F and C are time aligned and C is not a time delayed version of F.

Open Loop Digital Power Control Operation

In various embodiments, open loop operation is performed by bypassing the PI-controller 220 and setting smart power block 228 to write predetermined gain and bias settings in an open-loop manner under processor control. In this case, the processor 214 selects the gain and bias settings and the smart power block 228 applies these gain and bias settings in open loop manner. The ramp signal is applied directly at the first multiplier following the modulator 202, and bypassing PI-controller 220 and smart power block 228.

Closed Loop Digital Power Control Operation

Various embodiments include a closed loop operation, wherein the PI-controller's 220 output is applied to the low-latency DPC 252 input, which multiplies the digital signal prior to the DAC 204 to implement closed loop ramping. In this embodiment, the smart power block 228 holds the analog controls under processor control to fixed values while all of the ramping is applied to the low latency DPC DSP 252 input. Hence, the digital control will make up for the error left by the open loop power settings made by the processor.

Other combinations or hybrid approaches can include the processor selecting some settings, while the remaining settings are done by the loop.

In various embodiments, the power ramping can be done with a combination of the digital input and the SMPS 230, while keeping the remaining analog blocks at predetermined gain and bias settings by using the ramp look-up table 226 and the processor 214.

In various embodiments, the mapping of the PI-Out to the digital control is similar to the mapping shown in Table 1. The most negative output selects the smallest gain whereas the most positive output selects the highest gain.

Latency Related Issues

It is important to point out that though HW/SW partitioning of the implementation of the proposed method can be done in many ways, the driving factor of fast and precise ramp is the response time of the loop. Generally, the ramp occurs very fast within 10 us to 50 us for various cellular standards, and the processor cannot respond that fast to such an operation. Hence, a more appropriate role of the processor is to configure the loop before the next power ramp and to select the next values that will not be changed on the fly by the closed loop operation.

In various embodiments, the closed loop operation includes direct access of the gain and bias settings without intervening hardware that would slow down the update rate and create potential instability in the operation of the loop. In various embodiments, if a value cannot be updated at speed, the value is set by the processor and is not controlled by the PI controller error.

FIG. 9 illustrates a flowchart 900 according to various embodiments. Flowchart 900 includes one or more methods for power control of a transmitter. The various methods include but are not limited to any of the power control methods described herein. In various embodiments, the method or methods of flowchart 900 are performed by any of the system(s) or apparatus described herein, including but not necessarily limited to the device 100 illustrated in FIG. 1 of this specification, and/or the transmitter illustrated in FIG. 2 of this specification.

Retiring to FIG. 9, various embodiments include at 920 measuring an indication of an output power of a transmitter. An indication of output power can be any quantity (such as a voltage, a current, a field intensity, output power itself, a quantity that varies with output power, or any combination thereof), and it can be measured in any way (for example, a voltage can be measured with a voltage measuring circuit, a current can be measured with a coulomb counter, and so on). Measuring may include, but is not necessarily limited to, determining a numeral value or range for the indication of output power; any values that correspond to or that are reflective of output power may be, but are not necessarily limited to, numeral values or ranges. Values can generally be compared one to another, e.g., to determine whether one is greater than another, whether one has an average value greater than another, etc. Various embodiments include at 930 comparing the measured indication of output power of the transmitter to a desired output power for the transmitter. Determining a value for the desired output power is not limited to any particular method or techniques. For example, various embodiments include at 910 providing a desired output value for the desired output power, which includes but is not limited to providing a desired output value from a lookup table, or from a memory device. Various embodiments include at 912 receiving a command indicating a desired output power for the transmitter.

Various embodiments include at 932 determining a bias, a gain, or both a bias and a gain for at least one component of the transmitter. In various embodiments, the determination is made based on the comparison between the measured output power for the transmitter and the desired output power for the transmitter. Various embodiments include, but are not necessary limited to, making the determination(s) regarding bias, gain, or both bias and gain using any of the methods or techniques described herein.

Various embodiments include at 940 adjusting a bias, adjusting a gain, or adjusting both a bias and a gain for at least one component in the transmitter. In various embodiments, only a bias is adjusted for at least one component in the transmitter. In various embodiments, only a gain is adjusted for at least one component in the transmitter. In various embodiments, a bias and a gain are adjusted for at least one component in the transmitter. In various embodiments, at least a bias is adjusted on at least one component of the transmitter, and at least a gain is adjusted on a different component in the transmitter from the at least one component where the bias is adjusted. The application of the adjustment(s) of bias, gain, or both bias and gain are not limited to any number or combination of components in the transmitter. Any possible combination of adjustment(s) to bias alone, gain alone, or both bias and gain in connection with any combination of components included in the transmitter are contemplated by one or more embodiments of the present application.

EXAMPLE EMBODIMENTS

Embodiment 1 includes a method for controlling power in a transmitter, the method comprising: measuring an indication of an output power of the transmitter; comparing a first value corresponding to the indication of the output power to a second value corresponding to a desired output power; and adjusting a bias of at least one component in the transmitter in order to bring the output power closer to the desired output power.

Embodiment 2 includes the method of embodiment 1, wherein adjusting the bias of the at least one component adjusts the bias in order to reduce the current consumption of the at least one component.

Embodiment 3 includes the method of embodiments 1-2, wherein adjusting a bias includes adjusting a bias of multiple components selected from the group consisting of: a digital to analog converter, a mixer, a pre-power amplifier, and a power amplifier.

Embodiment 4 includes the method of embodiments 1-3, comprising: adjusting a gain of the at least one component in order to bring the output power closer to the desired output power.

Embodiment 5 includes the method of embodiment 4, wherein adjusting a gain includes adjusting a gain of multiple components selected from the group consisting of: a digital to analog converter, a mixer, and a pre-power amplifier.

Embodiment 6 includes the method of embodiments 1-5, comprising: adjusting a magnitude of power supplied to a power amplifier in the transmitter in order to reduce a power consumption of the power amplifier.

Embodiment 7 includes the method of embodiments 1-6, comprising: reading the second value from a look-up-table, the look-up-table including values corresponding to ramp functions from one power level to another power level.

Embodiment 8 includes a method for power control of a transmitter, the transmitter including a plurality of components, the method comprising: providing a desired output power; and repeatedly performing the following acts until an output power for the transmitter is substantially equal to the desired output power: measuring an indication of output power of the transmitter; comparing a first value corresponding to the indication of output power to a second value corresponding to a desired output power to determine an error value; determining a gain and bias for at least one component of the plurality of components based on the error value; and applying the gain and bias to the at least one component.

Embodiment 9 includes the method of embodiment 8, wherein determining includes determining a gain and bias that adjusts the output power closer to the desired output power while minimizing the current consumption of the at least one component.

Embodiment 10 includes the method of embodiments 8-9, wherein determining the gain and bias includes determining a gain and bias for more than one component of the plurality of components; and wherein applying the gain and bias includes applying the gain and bias to the more than one component.

Embodiment 11 includes the method of embodiment 8-10, comprising: reading a third value from a look-up-table, the third value corresponding to a bias for a first component of the plurality of components at the desired power level; and applying a bias to the first component based on the third value.

Embodiment 12 includes the method of embodiment 11, wherein repeatedly performing the following acts includes: determining a gain for the first component based on the error value and the bias from the look-up-table; and applying the gain to the first component.

Embodiment 13 includes a method for controlling transmitter power in a portable electronic device, the method comprising: receiving a command from a base station indicating a first output power for transmission; ramping an output power from a current output power to the first output power through a plurality of steps, wherein a step includes: reading a value from a ramp look-up-table, the value indicating an output power level for the step; and repeatedly adjusting a gain of at least one component based on feedback indicating a current output power level until the current output power level is substantially equal to the output power level for the step.

Embodiment 14 includes a portable electronic device having a transmitter comprising: a power amplifier; a coupler configured to obtain an indication of power for a signal at an output of the power amplifier; a controller configured to output an error signal as a function of a comparison between a value corresponding to the indication of power to a value corresponding to a desired output power; and an adjustment mechanism configured to determine a bias setting for the power amplifier as a function of the error signal, the adjustment mechanism configured to apply a bias to the power amplifier.

Embodiment 15 includes the portable electronic device of embodiment 14, comprising a digital to analog converter; a mixer; and a pre-power amplifier, wherein the adjustment mechanism is configured to determine a gain setting for at least one of the digital to analog converter, mixer, and pre-power amplifier as a function of the error signal.

Embodiment 16 includes the portable electronic device of embodiment 15, wherein the adjustment mechanism is configured to determine a bias setting for at least one of the digital to analog converter, mixer, and pre-power amplifier as a function of the error.

Embodiment 17 includes the portable electronic device of embodiment 14, wherein the adjustment mechanism is configured to determine a magnitude of power to supply to the power amplifier.

Another embodiment makes replica second power control loop (PI controller with reference and feedback signal) for VCC control through SMPS for the PA. This second power control loop is operated first to provide the lowest VCC voltage required to produce the desired output power. Then the first power control loop (shown in FIG. 2 minus SMPS DAC 232 and the connection from Smart Power 228 to this DAC) is then operated to provide the required output power.

Embodiment 18 includes a use of a portable electronic device for controlling power in a transmitter, the method comprising: measuring an indication of an output power of the transmitter; comparing a first value corresponding to the indication of the output power to a second value corresponding to a desired output power; and adjusting a bias of at least one component in the transmitter in order to bring the output power closer to the desired output power.

Embodiment 19 includes the use according to embodiment 18, comprising: adjusting a gain of the at least one component in order to bring the output power closer to the desired output power, preferably adjusting a gain including adjusting a gain of multiple components selected from the group consisting of: a digital to analog converter, a mixer, and a pre-power amplifier.

Embodiment 20 includes the use according to embodiments 18 and 19, comprising: adjusting a magnitude of power supplied to a power amplifier in the transmitter in order to reduce a power consumption of the power amplifier.

Embodiment 21 includes an apparatus that is adapted for performing the method of any one of embodiments 1 to 7.

Additional Notes

The above detailed description includes references to the accompanying drawings, which form a part of the detailed description. The drawings show, by way of illustration, specific embodiments in which the subject matter herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the subject matter should be determined with reference to the appended claims, along with the full scope of equivalents to which such claims are entitled.

What is claimed is:

1. A method for controlling power in a transmitter, the method comprising:
    measuring an indication of an output power of the transmitter;
    comparing a first value corresponding to the indication of the output power to a second value corresponding to a desired output power in order to create and error signal;
    based on the error signal, setting a power supply voltage to be applied to a power amplifier of the transmitter, the power amplifier including an output coupled to an antenna of the transmitter, wherein the power supply voltage is set as a voltage level to produce the desired output power from the transmitter, and
    based on the error signal, and after setting the power supply voltage of the power amplifier, adjusting a bias of at least one of a digital-to-analog converter, a mixer, and a pre-power amplifier, wherein the digital-to-analog converter, the mixer, and the pre-power amplifier are coupled to the power amplifier, and wherein adjusting the bias of at least one of the digital-to-analog converter, the mixer, and a pre-power amplifier includes adjusting the bias in order to achieve the desired output power for the transmitter.

2. The method of claim 1, wherein adjusting the bias of at least one of the digital-to-analog converter, the mixer, and the pre-power amplifier includes adjusting the bias in order to reduce the current consumption of at least one of the digital-to-analog converter, the mixer, and the pre-power amplifier.

3. The method of claim 1, wherein adjusting the bias includes adjusting a bias of multiple ones of the digital-to-analog converter, the mixer, and the pre-power amplifier.

4. The method of claim 1, further comprising:
    adjusting a gain of at least one of the digital-to-analog converter, the mixer, and the pre-power amplifier.

5. The method of claim 4, wherein adjusting the gain includes adjusting a gain of multiple ones of the digital-to-analog converter, the mixer, and the pre-power amplifier.

6. The method of claim 1, wherein setting the power supply voltage applied to the power amplifier includes using a switching power supply to adjust a magnitude of the power supply voltage supplied to the power amplifier.

7. The method of claim 1, further comprising:
    reading the second value from a look-up-table, the look-up-table including values corresponding to ramp functions from one power level to another power level.

8. A method for power control of a transmitter, the transmitter including a plurality of components, the method comprising:
    repeatedly performing the following acts until an output power for the transmitter is substantially equal to a desired output power:
    measuring an indication of output power of the transmitter;
    comparing a first value corresponding to the indication of output power to a second value corresponding to the desired output power to determine an error value;
    based on the error value, setting a power supply voltage to be applied to a power amplifier of the transmitter, the power amplifier including an output coupled to an antenna of the transmitter, wherein the power supply voltage is set as a voltage level to produce the desired output power from the transmitter, and
    based on the error value, and after setting the power supply voltage of the power amplifier, adjusting a bias of at least one of a digital-to-analog converter, a mixer, and a pre-power amplifier, wherein the digital-to-analog converter, the mixer, and the pre-power amplifier are coupled to the power amplifier, and wherein adjusting the bias of at least one of the digital-to-analog converter, the mixer, and a pre-power amplifier includes adjusting the bias in order to achieve the desired output power for the transmitter.

9. The method of claim 8, wherein adjusting the bias of at least one of the digital-to-analog converter, the mixer, and the pre-power amplifier includes determining a bias that adjusts the output power closer to the desired output power while minimizing a current consumption of at least one of the digital-to-analog converter, the mixer, and the pre-power amplifier.

10. The method of claim 8, wherein adjusting the bias of at least one of the digital-to-analog converter, the mixer, and the pre-power amplifier includes determining a gain and bias for more than one of the digital-to-analog converter, the mixer, and the pre-power amplifier.

11. The method of claim 8, comprising:
    reading a third value from a look-up-table, the third value corresponding to the bias for at least one of the digital-to-analog converter, the mixer, and the pre-power amplifier at the desired power level; and
    applying the bias to the at least one of the digital-to-analog converter, the mixer, and the pre-power amplifier based on the third value.

12. The method of claim 11, wherein repeatedly performing the following acts includes:
    determining a gain for at least one of the digital-to-analog converter, the mixer, and the pre-power amplifier based on the error value and the bias from the look-up-table; and
    applying the gain to at least one of the digital-to-analog converter, the mixer, and the pre-power amplifier.

13. A method for controlling transmitter power in a portable electronic device, the method comprising:
    receiving a command from a base station indicating a first output power for transmission;
    ramping an output power from a current output power to the first output power through a plurality of steps, wherein a step includes:
    reading a value from a ramp look-up-table, the value indicating an output power level for the step; and repeatedly adjusting setting of components of the transmitter based on feedback indicating a current output power level of the transmitter until the current output power level of the transmitter is substantially equal to the output power level for the step, wherein adjusting at least one component for the step includes:

based on the feedback indicating the current power level, setting a power supply voltage to be applied to a power amplifier of the transmitter, the power amplifier including an output coupled to an antenna of the transmitter, wherein the power supply voltage is set as a voltage level to produce the desired output power for the step, and based on the feedback indicating the current power level, and after setting the power supply voltage of the power amplifier, adjusting a bias of at least one of a digital-to-analog converter, a mixer, and a pre-power amplifier, wherein the digital-to-analog converter, the mixer, and the pre-power amplifier are coupled to the power amplifier, and wherein adjusting the bias of at least one of the digital-to-analog converter, the mixer, and a pre-power amplifier includes adjusting the bias in order to achieve the desired output power for the step.

14. A portable electronic device having a transmitter comprising:

a power amplifier;

a digital to analog converter, a mixer, and a pre-power amplifier coupled to the power amplifier;

a coupler configured to obtain an indication of power for a signal at an output of the power amplifier;

a controller configured to output an error signal as a function of a comparison between a value corresponding to the indication of power to a value corresponding to a desired output power; and an adjustment mechanism configured to, based on an error signal, determine a setting for a power supply voltage to be applied to the power amplifier of the transmitter, wherein the power supply voltage is set as a voltage level to produce the desired output power from the transmitter, and the adjustment mechanism further configured to determine a bias setting for the power amplifier as a function of the error signal, the adjustment mechanism configured to apply a bias to the power amplifier, and wherein the adjustment mechanism is configured to determine and apply a gain setting for at least one of the digital to analog converter, mixer, and re-power amplifier as a function of the error signal.

15. The portable electronic device of claim 14, wherein the adjustment mechanism is configured to determine a bias setting for at least one of the digital to analog converter, the mixer, and the pre-power amplifier as a function of the error signal.

16. The portable electronic device of claim 14, wherein the adjustment mechanism includes a switching power supply, wherein the switching power supply is coupled to the power amplifier and is configured to determine a magnitude of the power supply voltage to supply to the power amplifier.

* * * * *

UNITED STATES PATENT AND TRADEMARK OFFICE
CERTIFICATE OF CORRECTION

PATENT NO. : 8,478,213 B2
APPLICATION NO. : 13/273768
DATED : July 2, 2013
INVENTOR(S) : Khurram Muhammad It is certified that error appears in the above-identified patent and that said Letters Patent is hereby corrected as shown below:

In the Claims:

In column 19, line 33, in Claim 1, delete "and" and insert --an--, therefor

In column 19, line 39, in Claim 1, delete "transmitter," and insert --transmitter;--, therefor In column 22, line 17, in Claim 14, delete "re-power" and insert --pre-power--, therefor Signed and Sealed this
Twenty-second Day of April, 2014

Michelle K. Lee
*Deputy Director of the United States Patent and Trademark Office*